United States Patent [19]

Baumberger et al.

[11] Patent Number: 5,230,632

[45] Date of Patent: Jul. 27, 1993

[54] DUAL ELEMENT ELECTRICAL CONTACT AND CONNECTOR ASSEMBLY UTILIZING SAME

[75] Inventors: John G. Baumberger, Johnson City; James J. Kershaw, Endwell; James R. Petrozello, Endicott, all of N.Y.

[73] Assignee: International Business Machines Corporation, Armonk, N.Y.

[21] Appl. No.: 810,601

[22] Filed: Dec. 19, 1991

[51] Int. Cl.$^5$ .............................................. H01R 9/09
[52] U.S. Cl. ...................................... 439/66; 439/74; 439/591; 439/886
[58] Field of Search ................... 439/66, 74, 80-82, 439/161, 247, 591, 886, 887, 889, 908

[56] References Cited

U.S. PATENT DOCUMENTS

| | | |
|---|---|---|
| 1,121,011 | 3/1982 | Babuka et al. . |
| 3,795,884 | 3/1974 | Kotaka . |
| 3,842,189 | 10/1974 | Southgate . |
| 3,851,297 | 11/1974 | Munro . |
| 3,913,444 | 10/1975 | Otte ........................ 439/161 |
| 3,924,915 | 12/1975 | Conrad . |
| 3,951,493 | 4/1976 | Kozel et al. . |
| 3,960,424 | 6/1976 | Weisenburger . |
| 4,027,935 | 6/1977 | Byrnes et al. . |
| 4,203,203 | 5/1980 | Gilissen et al. . |
| 4,402,562 | 9/1983 | Sado . |
| 4,548,451 | 10/1985 | Benarr et al. . |
| 4,553,192 | 11/1985 | Babuka et al. . |
| 4,575,166 | 3/1986 | Kasdagly et al. . |
| 4,655,519 | 4/1987 | Evans et al. . |
| 4,662,702 | 5/1987 | Furuya ........................ 439/886 |
| 4,813,129 | 3/1989 | Karnezos ........................ 439/74 |
| 4,906,194 | 3/1990 | Grabbe . |
| 4,927,369 | 5/1990 | Grabbe et al. . |
| 4,961,709 | 10/1990 | Noschese ........................ 439/66 |
| 4,969,826 | 11/1990 | Grabbe . |
| 4,973,256 | 11/1990 | Peters ........................ 439/66 |
| 5,007,842 | 4/1991 | Deak . |
| 5,013,248 | 5/1991 | Brown et al. . |
| 5,026,290 | 6/1991 | Dery . |
| 5,030,109 | 7/1991 | Dery . |
| 5,035,628 | 7/1991 | Casciotti et al. . |
| 5,037,311 | 8/1991 | Frankeny et al. . |
| 5,061,192 | 10/1991 | Chapin et al. . |
| 5,118,299 | 6/1992 | Burns et al. ........................ 439/74 |

OTHER PUBLICATIONS

"MCM Design and Interconnection Techniques", D. G. Grabbe, Connection Technology, Jun. 1991 (pp. 18-21).

IBM Technical Disclosure Bulletin (TDB), vol. 6, No. 8, Jan. 1964 (pp. 23,24).

Primary Examiner—Paula A. Bradley
Attorney, Agent, or Firm—Lawrence R. Fraley

[57] ABSTRACT

An electrical contact and connector assembly utilizing same wherein the contact includes a first, highly conductive element (e.g., oxygen-free copper) having a first modulus of elasticity and including a pair of contacting portions each of which is designed for engaging respective conductors on first and second circuit members, and a second, spring element (e.g., stainless steel) operatively coupled to the first conductive element and having a second modulus of elasticity greater than that of the first, conductive element. A connector assembly is also defined which includes a common housing for having the contact (preferably several) located therein. The housing is metallic (e.g., stainless steel) and includes a coating of suitable dielectric material on appropriate surfaces thereof so as to prevent electrical shorting with the internally contained contacts. A preferred coating for this purpose is polyimide.

23 Claims, 2 Drawing Sheets

DUAL ELEMENT ELECTRICAL CONTACT AND CONNECTOR ASSEMBLY UTILIZING SAME

TECHNICAL FIELD

The invention relates to the field of electrical connectors and particularly to electrical connectors for interconnecting at least two electrical circuit members such as printed circuit boards, circuit modules or the like. Even more particularly, the invention relates to connectors of this type which may be used in the information handling system (computer) environment.

BACKGROUND OF THE INVENTION

It is extremely important in connector design for those connectors utilized in the computer field to provide both high density and highly reliable connections between various circuit devices which form important parts of the computer. High reliability for such connections is essential due to potential end product failure, should vital misconnections of these devices occur. Further, to assure effective repair, upgrade, and/or replacement of various components of the system (i.e., connectors, cards, chips, boards, modules, etc.), it is also highly desired that such connections be separable and reconnectable (e.g., in the field) within the final product, as well as tolerant of dust and fibrous debris. Such a capability is also desirable during the manufacturing process for such products, e.g., to facilitate testing.

A known technique for providing circuit interconnections is referred to as a wire bond technique, which involves the mechanical and thermal compression of a soft metal wire, e.g., gold, from one circuit to another. Such bonding, however, does not lend itself readily to high density connections because of the potential for wire breakage and accompanying mechanical difficulty in wire handling. Another technique involves strategic placement of solder balls or the like between respective circuit elements, e.g., pads, and reflowing the solder to effect interconnection. While this technique has proven extremely successful in providing high density interconnections for various structures, this technique does not allow facile separation and subsequent reconnection. In yet another technique, an elastomer has been used which included therein a plurality of conductive paths, e.g., small diameter wires or columns of conductive material, to provide the necessary interconnections. Known procedures using such material typically possess the following deficiencies: (1) high force necessary per contact which can be inherent in a particular design and exacerbated due to non-planarity of the mating surfaces; (2) relatively high electrical resistance through the interconnection between the associated circuit elements, e.g., pads; (3) sensitivity to dust, debris and other environmental elements which could readily adversely affect a sound connection; and (4) limited density, e.g., due to physical limitations of particular connector designs.

The present invention as defined herein utilizes a plurality of mini spring contacts adapted for being positioned in a suitable housing to electrically connect one circuit member (e.g., an integrated circuit module) to a second circuit member (e.g., a printed circuit board). Examples of connector arrangements which utilize such mini-type contacts are illustrated in U.S. Pat. Nos. 4,553,192; 4,655,519; 4,906,194; 4,927,369; and 4,969,826.

The present invention represents an improvement over such known contacts by providing enhanced connectability and conductivity, while still assuring relative ease of connector assembly, repair and replacement. Still further, the present invention provides a contact design that is adaptable to mass production to thus assure relatively low costs thereof.

It is believed that such a contact, and a connector assembly adapted for using same, would constitute a significant advancement in the art.

DISCLOSURE OF THE INVENTION

It is, therefore, a primary object of the present invention to enhance the electrical connector art.

It is another object of the invention to provide an electrical contact which in turn provides enhanced conductivity over known contact designs.

It is yet another object of the invention to provide such a contact which is producible at reasonable costs and which can be readily incorporated into an overall larger connector assembly utilizing several such contacts.

It is a further object of the invention to provide a connector assembly which utilizes such contacts, in a high density array, to provide sound, effective electrical connections between two separate electrical circuit members.

In accordance with one aspect of the invention, there is provided an electrical contact for electrically interconnecting first and second circuit members wherein the contact comprises a first, conductive element having a first modulus of elasticity and including first and second contacting portions for engaging the first and second circuit members, respectively, and a second spring element operatively coupled to the first, conductive element and having a second modulus of elasticity greater than the modulus of elasticity of the first, conductive element.

In accordance with another aspect of the invention, there is provided an electrical connector assembly adapted for electrically interconnecting first and second circuit members, wherein the assembly comprises a housing adapted for being positioned between both circuit members, and a plurality of electrical contacts spacedly positioned within the housing. Selected ones of these contacts each include a first, conductive element having a first modulus of elasticity and including first and second contacting portions for engaging the first and second circuit members, respectively, and a second, spring element operatively coupled to the first conductive element and having a second modulus of elasticity greater than the modulus of elasticity of the first, conductive element.

BEST MODE FOR CARRYING OUT THE INVENTION

For a better understanding of the present invention, together with other and further objects, advantages and capabilities thereof, reference is made to the following disclosure and appended claims in connection with the above-described drawings.

Figure 1:
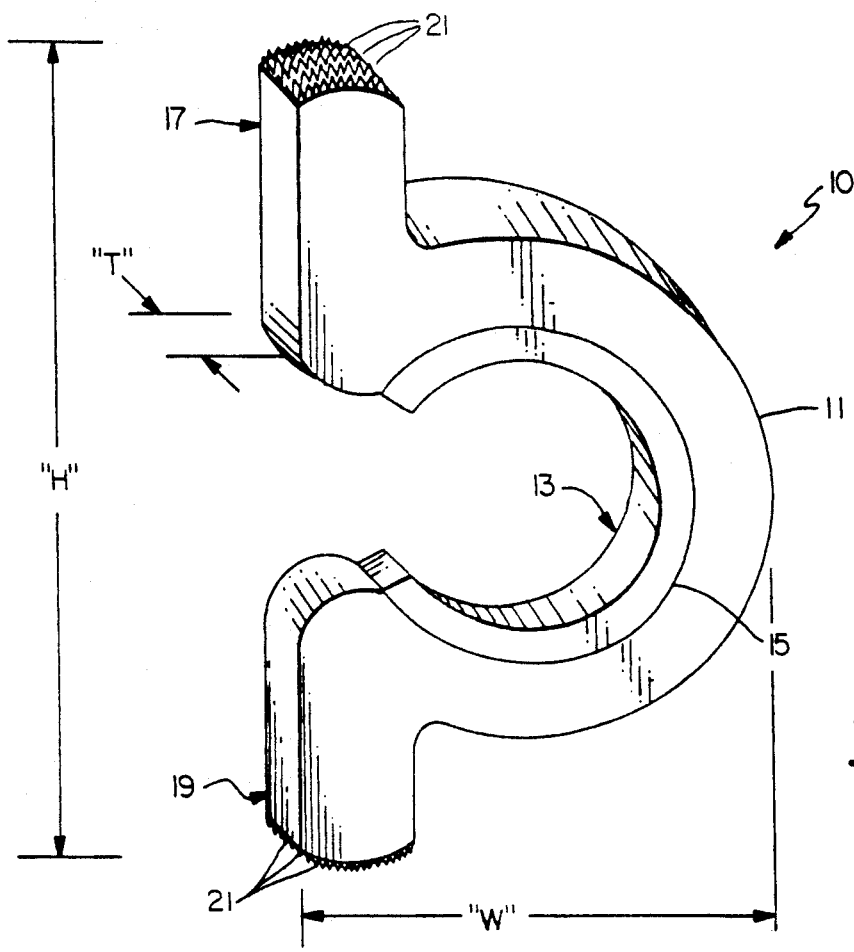
FIG. 1 is a perspective view, on a much enlarged scale, of a dual element contact in accordance with a preferred embodiment of the invention.

In FIG. 1, there is shown a dual element electrical contact 10 in accordance with a preferred embodiment of the invention. Contact 10, as defined herein, is particularly adapted for providing electrical connection between a pair of opposed electrical circuit members when positioned within a suitable housing designed to accommodate such contacts. The housing (FIG. 2) is further adapted for being located between the two circuit members being connected. Examples of suitable circuit members for being interconnected by contact 10 (and the connector assembly utilizing same) include printed circuit boards, circuit modules, etc. By the term printed circuit board is meant to include a multilayered circuit structure including one or more conductive (e.g., signal, power and/or ground) layers therein. Such printed circuit boards, also known as printed wiring boards, are well known in the art and further description is not believed necessary. By the term circuit module is meant to include a substrate or the like member having various electrical components (e.g., semiconductor chips, conductive circuitry, conductive pins, etc.) which may form part thereof. Such modules are mentioned in U.S. Pat. Nos. 4,688,151 and 4,912,772, and further description is thus not believed necessary. The disclosures of these patents are thus incorporated herein by reference.

In a preferred embodiment of the invention, contact 10, and the connector assembly utilizing same, is adapted for connecting the several contact sites (e.g., conductive pads) of an integrated circuit module to respective contact sites (e.g., conductive pads) on a printed circuit board when both circuit members are appropriately aligned. This particular form of interconnection, including appropriate means for circuit member and housing alignment, is defined in U.S. Pat. Nos. 4,553,192 and 5,061,192, both of which are assigned to the same assignee as the present invention. U.S. Pat. Nos. 4,553,192 and 5,061,192 are thus incorporated herein by references.

As shown in FIG. 1, the dual element electrical contact 10 includes a first, conductive element 11 and second, spring element 13 which, as shown, is joined to the externally positioned conductive element 11 along a common interface 15. First conductive element 11 includes first and second contacting portions 17 and 19, respectively which, as shown in FIG. 1, are located substantially directly opposite each other and face away in opposing directions. As understood from the description herein, the function of each contacting portion is to make electrical contact with a respective contact location (e.g., conductive pad) on a respective one of the circuit members being connected. First conductive element 11 includes a first modulus of elasticity which, as understood, is less than that of the internally positioned, spring element 13.

In a preferred embodiment of the invention, first conductive element 11 was comprised of oxygen-free copper to thereby assure optimum electrical conductivity through contact 10 when connection is achieved. Such optimum conductivity thus assures fast switching times and low resistance, both highly desired capabilities for elements such as contacts of the type defined herein. A preferred oxygen-free copper is Copper Development Association (CDA) type C10200, having a modulus of elasticity of about $17 \times 10^6$ pounds per square inch (PSI). C10200 also has a yield strength, annealed, of about 10-11 ($\times 10^3$) PSI, and an electrical conductivity (percent IACS) of 101 (or 0.586 megmho-cm.). Other acceptable materials for element 11 include annealed gold (having a modulus of elasticity of $12 \times 10^6$ PSI and electrical conductivity of 0.46 megmho-cm), annealed silver (modulus of elasticity of $11 \times 10^6$ PSI and conductivity of 0.63 megmho-cm) and type 1060 annealed aluminum (having a modulus of elasticity of $10 \times 10^6$ PSI and conductivity of 0.36 megmho-cm). Annealed silver and type 1060 annealed aluminum possess tensile yield strengths of $8 \times 10^3$ PSI and $4 \times 10^3$ PSI, respectively, while the yield strength of gold, as annealed, is nil. Understandably, these materials possess extremely high electrical conductivity values. It is also desirable in the present invention to overplate, except for gold conductors, the conductive element 11 with both nickel and gold to improve long term reliability (e.g., particularly in harsh environments).

To impart the necessary spring force for the resulting, dual element structure shown herein, the internal, second spring element 13 is provided. In a preferred embodiment of the invention, element 13 is comprised of stainless steel. As such, this element possessed a second modulus of elasticity greater than the outer, conductive element 11. The preferred stainless steel (AISI 414) used in the embodiment depicted in FIG. 1 possesses a modulus of elasticity of about $29 \times 10^6$ PSI, or approximately 1.7 times that of the aforementioned oxygen-free copper. Alternative materials for spring element 13 include phosphor bronze and beryllium copper. AISI 414 stainless steel possesses an electrical conductivity of only about 0.014 megmho-cm, while CDA 17200 beryllium copper and CDA 52100 phosphor bronze possess conductivities of 0.128 megmho-cm and 0.075 megmho-cm, respectively. The modulus of elasticity of this beryllium copper is about $18.5 \times 10^6$ PSI, while the phosphor bronze modulus of elasticity is about $16 \times 10^6$ PSI. The defined yield strengths for such materials are: (1) AISI 414 stainless steel, 105-150$\times 10^3$ PSI; (2) C 17200 beryllium copper, 70-180$\times 10^3$ PSI; and (3) C 52100 phosphor bronze, 72-80$\times 10^3$ PSI. The above CDA ratings, as provided, are from Copper Development Association, Inc., having an office at Greenwich Office Park 2, Greenwich, Conn. This company is a recognized source in the industry.

In accordance with the teachings herein, it is preferred that the ratio of moduli of elasticity for the second, spring elements for use in the invention in comparison to the moduli of elasticity for conductive elements which form part of the invention will be within the range of from about 3:1 to about 1:1 (the spring element's modulus always being greater, even at this lower range, albeit slightly). As stated above, contact 10 is of the mini variety. In one example of the invention, such a contact having the configuration depicted in FIG. 1 possessed a height (dimension "H") of about 0.110 inch, a thickness (dimension "T") of about 0.010 inch and an overall width (dimension "W") of about 0.075 inch. The above dimensions are representative only, and not meant to limit the invention.

Spring element 13, as shown in FIG. 1, is preferably of substantially C-shaped configuration. As further shown in FIG. 1, and as described above, this spring element 13 is located internally of the larger, externally positioned highly conductive element 11. Preferably, spring element 13 is welded or similarly bonded (e.g., at one or more different locations) to the external conductive element 11. This is not meant to limit the invention, however, in that such a permanent attachment is not necessary. For example, it is within the broader aspects of the invention to frictionally fit the internal spring element in position. To further enhance the electrical connection between contact 10 (and, specifically, the outwardly projecting contacting portions 17 and 19), the terminal ends of each contacting portion 17 and 19 may be provided with a plurality of interdigitated conductive elements 21. Such elements are preferably of the dendritic variety and may be comprised of known metallic materials (e.g., palladium) available in the art. Examples of such materials are fully defined in Canadian Patent 1,121,011, assigned the same assignee as the present invention. On page 6, lines 26-31 of the Canadian patent, such elements are defined as being formed by a dendritic growth of conductive metal crystals. Page 7, lines 19-23 of this patent further defines one method of growing such dendritic structures as being electroplating, including, for example, electroplating at a higher than normal current density with a plating solution having a lower than normal concentration of metal ions. See page 19, lines 10-16. This patent goes on in detail to define the various sizes, materials, etc. for such structures. This patent is thus incorporated herein by reference. By providing a contact of the structure depicted in FIG. 1, it is understood that the outermost contacting portions 17 and 19 of this structure, possessing the modulus of elasticity defined herein, are capable of being slightly displaced (e.g., compressed) from their original positions so as to thus move toward each other from said original position when the contact is subjected to the compressive forces typically utilized in the prior art to effect connection between such elements and many known circuit members (e.g., an integrated circuit module and a printed circuit board). Such forces, as is known, may range from about 30 grams to about 100 grams, which is distributed over the plurality of contacts forming the necessary interconnections. The conductive pads or the like on the circuit members are typically comprised of copper or similar material which is typically harder than that of this defined, conductive material for element 11 (e.g., plated with nickel and then gold). Slight deformation of element 11 is thus readily possible and contact 11 is uniquely designed to provide this capability, if necessary. Significantly, however, the internal spring element 13 retains its spring rate and thus is able to continuously assure that the resulting, dual element structure will provide a desired spring force during engagement with the respective circuit members.

Figure 2:
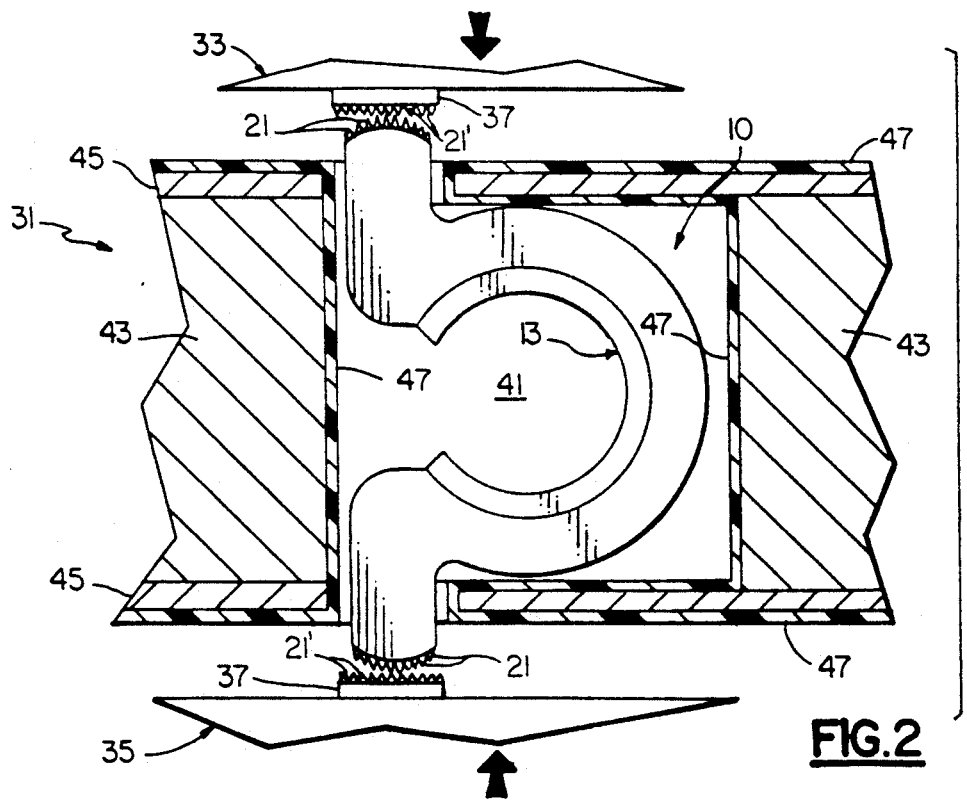
FIG. 2 is a partial, side elevational view, in section and on a slightly reduced scale over the view of FIG. 1, illustrating the contact of FIG. 1 in a housing structure, to form a connector assembly in accordance with a preferred embodiment of the invention.
Figure 3:
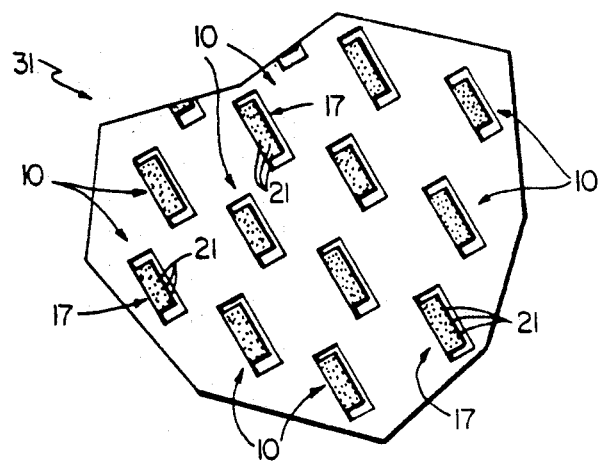
FIG. 3 is a partial plan view, illustrating a plurality of contacts of the invention as positioned within a housing such as illustrated in FIG. 2.

In FIG. 2, electrical contact 10 is shown as being positioned within a housing 31 which, as shown, is adapted for being positioned substantially between first and second circuit members 33 and 35, respectively. As stated above, one of these circuit members is preferably an integrated circuit module while the other (typically the lower) is preferably a printed circuit board. The respective conductive elements 37 (e.g., pads) are also illustrated in FIG. 2. As stated, these are preferably of copper or similar metallic material (and overplated with nickel and gold) and, understandably, are electrically coupled to designated circuitry (not shown) within the respective circuit member. It is understood that in a preferred embodiment of the invention, several contacts 10 are utilized within a common housing 31 to provide the high density interconnection taught herein. An array of such contacts 10 is shown in FIG. 3, each spacedly positioned within the common housing 31. In FIG. 3, only a respective one of the projecting, contacting portions are shown. In the embodiment of FIG. 3, for example, the ends 17 are shown, each including a plurality of the aforementioned dendritic elements 21 thereon. In one embodiment of the invention, a total of about 16,000 contacts 10 can be positioned within a common housing 31 at a density within the range of about four hundred to about five hundred contacts per square inch. It is appreciated that such close spacing represents a highly dense array of such members.

In FIG. 2, housing 31 is shown to include a chamber 41 for having contact 10 located therein (a chamber thus being provided for each such contact). Chamber 41, in comparing FIGS. 2 and 3, is understood to be substantially rectangular and of an internal width slightly greater than the corresponding thickness (dimension "T") for contact 10. Significantly, housing 11 includes a main body portion 43 which is of electrically conductive material (e.g., stainless steel, copper or electrically conductive polymer such as carbon-filled, liquid crystal polymer) and further includes a pair of opposed cover members 45, also conductive (e.g., of the same materials as body portion 43) for being secured to the upper and lower surfaces of body portion 31 to assist in containing each contact 10 within the housing. Covers 45 may be secured to body portion 31 by any acceptable means, e.g., appropriate clamping or the like. Significantly, at least one of these covers is preferably removable to facilitate subsequent removal of contact(s) 10 in the event of repair and/or replacement. Housing 31 is also preferably electrically coupled to electrical ground within the assembly (not shown) utilizing the connector and contacts described herein. Such grounding is desired to provide effective electrical shielding (against electrical noise and signal cross talk) for each of the contacts 10 during operation. By way of example, housing 31 may be electrically connected (e.g., using a suitable spring, not shown) to the ground of circuit member 33 and/or circuit member 35. It is also within the scope of the invention to utilize one or more of contacts 10 for this purpose, said contacts being allowed to directly contact (engage) the conductive housing and/or covers if used for this purpose.

To prevent electrical shorting between each of the metallic surfaces of contact 10 and the respective metallic surfaces of housing 31 and cover members 45, a dielectric coating 47 is applied to the housing's surfaces adjacent contact 10. A preferred dielectric material for coating 47 is polyimide. Other acceptable materials include polytetrafluoroethylene (e.g., Teflon, a trademark of E. I. du Pont de Nemours and Company) and epoxy. Coating 47 is preferably applied by dipping or vapor deposition (and cure).

To further enhance the connection formed between contact 10 and the respective circuit members 33 and 35, each of the conductive pads 37 of these circuit members may also be provided with dendritic elements 21′ similar to those elements 21 on contacting portions 17 and 19.

It is understood that the connection formed by the assembly depicted in FIG. 2 is a non-wiping contact between the contact's contacting portions 17 and 19 and the respective conductive pads 37. By non-wiping is meant that these surfaces do not move relative to one another in a lateral direction once engagement therebetween is initiated. Such wiping motion is not desired in the present invention because it may damage the dendritic contact surfaces and also requires a relatively larger conductive pad size (thereby reducing overall density).

Figure 4:
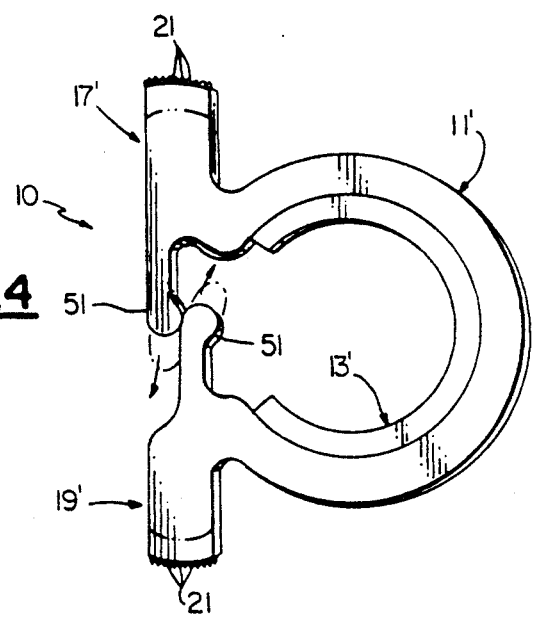
FIGS. 4–6 represent side elevational views of dual element electrical contacts in accordance with alternative embodiments of the invention, the contacts of FIGS. 4-6 being on a slightly reduced scale over the view of FIG. 1.
Figure 5:
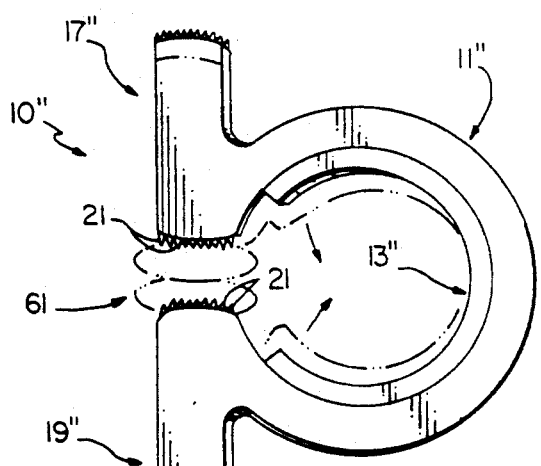

In FIGS. 4 and 5, there are shown alternative embodiments of the contact of the invention. In FIG. 4, contact 10' is shown to include an internally positioned spring element 13' and an externally positioned conductive element 11', these elements preferably being of the same material as used for contact 10 in FIG. 1. Contact 10' in FIG. 4 is modified, however, over the embodiment in FIG. 1 through the provision of a pair of sliding protuberances 51 which, as shown, form appendages to the respective contacting portions 17' and 19'. Each conducting protuberance 51 maintains continuous engagement against the other such protuberance both prior to and during contact connection with the respective circuit members. During compression, each protuberance moves in the manner represented by the arrows in FIG. 4. Such sliding contact thus provides a shorter circuit path between contacting portion 17' and 19' to thus assure a contact 10' with an overall faster switching time than that contact depicted in FIG. 1. Contact 10' preferably is of the same overall dimensions as contact 10 in FIG. 1 and also preferably includes the aforedefined dendritic elements 21 as part thereof. In FIG. 5, yet another embodiment of a contact in accordance with the teachings herein is provided. In FIG. 5, contact 10" is shown to include a substantially C-shaped internal spring element 13" similar to the spring element in FIG. 1, this element being internally positioned within an external conductive element 11". In FIG. 4, however, the projecting contacting portions 17" and 19" are of extended configuration over those shown in FIG. 1 such that the internal spacing 61 therebetween is substantially less than that in FIG. 1. In one example of the invention, this internal spacing 61 is preferably from only about 0.005 inch to about 0.010 inch. The preferred materials for elements 11" and 13" are the same as those in FIG. 1. By virtue of this minimal spacing between contacting portion 17" and 19", compression of first, conductive element 11" results in closure of contacting portion 17" and 19" to thus provide electrical connection therebetween. Such connection, like the embodiment of FIG. 4, thus provides a shortened electrical path across contact 10". The engaged internal portions of contacting portions 17" and 19" are illustrated in phantom in FIG. 5. To further enhance connection across these two engaged portions, the internal surfaces thereof are each provided with a plurality of the aforedefined dendritic elements 21. It is understood that in the embodiment of FIG. 5, once contacting portion 17" and 19" have been compressed and thus displaced, to the point of engagement between the internal portions thereof (shown in phantom in FIG. 5), that following this connection, these displaced portions will remain substantially deformed (to the approximate shape depicted in phantom in FIG. 5). Separation will then occur (due to the force exerted by spring 13") when disengagement with the respective circuit member(s) occurs, but the displaced (and deformed) portions will retain the approximate shape illustrated. This ability to deform assures effective connection between all such contacts in situations of non-planarity of one or both of the circuit members being joined. Contact 10" preferably possesses substantially the same initial, overall dimensions as the embodiment in FIG. 1, prior to compression thereof.

Figure 6:
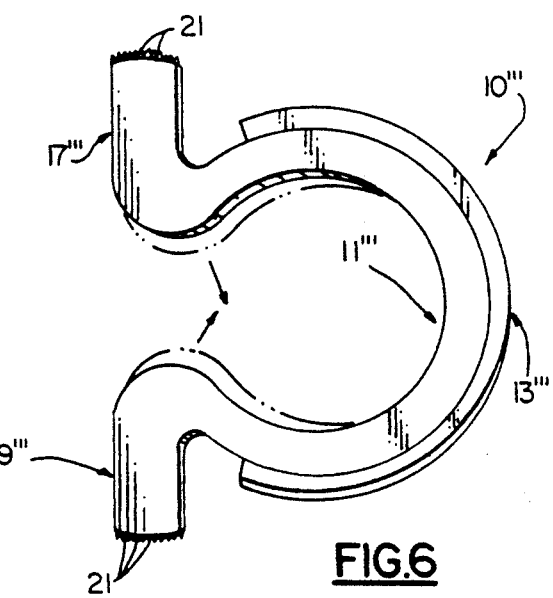

In FIG. 6, there is shown a contact 10''' in accordance with yet another embodiment of the invention. Contact 10''', unlike the aforedefined contacts above, positions the second, spring element 13''' externally of an internally positioned first, conductive element 11'''. Both elements 11''' and 13''' are of the same materials as defined above for the contacts in FIGS. 1, 4 and 5. The external spring 13''' is preferably secured to the outer periphery of conductive element 11''' by welding or the like. The spring element 13''' is also preferably of substantially C-shaped configuration. The internal conductive element 11''' includes projecting contacting portions 17''' and 19''' similar to those above. Further, each such contacting portion includes a plurality of dendritic conductive elements 21 thereon. During compression of contact 10''', these contacting portions will be deflected internally to the approximate configuration illustrated in phantom in FIG. 6. Contact 10''' is preferably of substantially the same original, overall dimensions as the contact in FIG. 1.

There has thus been shown and described a dual element electrical contact wherein one of the elements is of a highly conductive material (e.g., oxygen-free copper) designed substantially for the purpose of providing an electrical path across the contact during engagement with designated conductors of circuit members to which connection is provided. In order to assure appropriate spring forces for such a contact, the invention further includes a second element, referred to as a spring element, having a modulus of elasticity greater than that of the malleable, highly conductive element. As understood, such a spring element does not serve to provide a main conductive path for the final structure but instead provides the main function of exerting an appropriate spring force against the malleable conductive element such that this conductive element will effectively engage the circuit member conductors. That is, the invention utilizes two elements of substantially similar cross-sections and possessing substantially the same curvature. Being contiguous, and with one being more ductile (or malleable) and with a lower stress yield point, the more ductile element is relatively passive in such a dual structure so that the spring rate of the resulting structure is primarily defined by the other element (that having the higher stress yield point). Accordingly, the present invention utilizes two elements wherein one is comprised of a material having a substantially greater conductivity to currently available singular element spring contacts, while still providing the requisite spring force to effect positive electrical connections as desired.

As stated, in a preferred embodiment of the invention, the highly conductive element is slightly deformed during such engagement, and such deformation is deemed acceptable while still assuring subsequent use of the contact in a separate contact arrangement. The above results are achieved utilizing materials having specific moduli of elasticity and combining these materials in the configurations and relationships depicted herein such that one (the spring element) is operatively connected to the other (the conductive element).

While there have been shown and described what are at present considered the preferred embodiments of the invention, it will be obvious to those skilled in the art that various changes and modifications may be made therein without departing from the scope of the invention as defined by the appended claims.

What is claimed is:

1. An electrical contact for electrically interconnecting first and second circuit members, said contact comprising:
   a first malleable conductive element comprised of metallic material and having a first modulus of elasticity and including first and second opposed contacting portions for engaging said first and second circuit members, respectively; and
   a second, spring element comprised of metallic material and joined to said first, conductive element in direct physical contact therewith, said second, spring element having a second modulus of elasticity greater than said first modulus of elasticity of said first, conductive element, said electrical contact being of substantially C-shaped configuration.

2. The electrical contact according to claim 1 wherein said first, conductive element possesses a first modulus of elasticity within the range of from about $10 \times 10^6$ PSI to about $17 \times 10^6$ PSI.

3. The electrical contact according to claim 1 wherein said second, spring element possesses a second modulus of elasticity within the range of from about $16 \times 10^6$ PSI to about $29 \times 10^6$ PSI.

4. The electrical contact according to claim 1 wherein said metallic material of said first, conductive element is selected from the group consisting essentially of oxygen-free copper, annealed gold, annealed silver and annealed aluminum.

5. The electrical contact according to claim 1 wherein said metallic material of said second, spring element is selected from the group consisting essentially of stainless steel, phosphor bronze and beryllium copper.

6. The electrical contact according to claim 1 wherein said first, conductive element is positioned along an external surface of said second, spring element.

7. The electrical contact according to claim 1 wherein said first, conductive element is positioned along an internal surface of said second, spring element.

8. The electrical contact according to claim 1 wherein the ratio of said second modulus of elasticity to said first modulus of elasticity is within the range of from about 3:1 to about 1:1.

9. The electrical contact according to claim 1 wherein said first and second contacting portions of said first, conductive element each include a plurality of dendritic elements thereon, said dendritic elements being growth elements of conductive metal crystals.

10. An electrical connector assembly for electrically interconnecting first and second circuit members, said assembly comprising:
    a housing adapted for being positioned substantially between said first and second circuit members; and
    a plurality of electrical contacts spacedly positioned within said housing, selected ones of said electrical contacts including a first, malleable conductive element comprised of metallic material and having a first modulus of elasticity and including first and second opposed contacting portions for engaging said first and second circuit members, respectively, and a second, spring element comprised of metallic material and joined to said first, conductive element in direct physical contact therewith and having a second modulus of elasticity greater than said first modulus of elasticity of said first, conductive element, said electrical contact being of substantially C-shaped configuration.

11. The electrical connector assembly according to claim 10 wherein said first, conductive element possesses a first modulus of elasticity within the range of from about $10 \times 10^6$ PSI to about $17 \times 10^6$ PSI.

12. The electrical connector assembly according to claim 10 wherein said second, spring element possesses a second modulus of elasticity within the range of from about $16 \times 10^6$ PSI to about $29 \times 10^6$ PSI.

13. The electrical connector assembly according to claim 10 wherein said metallic material of said first, conductive element is selected from the group consisting essentially of oxygen-free copper, annealed gold, annealed silver and annealed aluminum.

14. The electrical connector assembly according to claim 10 wherein said metallic material of said second, spring element is selected from the group consisting essentially of stainless steel, phosphor bronze and beryllium copper.

15. The electrical connector assembly according to claim 10 wherein said first, conductive element is positioned along an external surface of said second, spring element.

16. The electrical connector assembly according to claim 10 wherein said first, conductive element is positioned along an internal surface of said second, spring element.

17. The electrical connector assembly according to claim 10 wherein the ratio of said second modulus of elasticity to said first modulus of elasticity is within the range of from about 3:1 to about 1:1.

18. The electrical connector assembly according to claim 10 wherein said first and second contacting portions of said first, conductive element each include a plurality of dendritic elements thereon, said dendritic elements being growth elements of conductive metal crystals.

19. The electrical connector assembly according to claim 10 wherein said housing includes a plurality of chambers therein, said electrical contacts being positioned within respective ones of said chambers.

20. The electrical connector assembly according to claim 19 wherein said housing is comprised of metallic material and includes a layer of electrically insulative material at selected locations thereon to prevent electrical shorting between said electrical contacts and said metallic material of said housing.

21. The electrical connector assembly according to claim 20 wherein said metallic material of said housing is selected from the group consisting essentially of stainless steel, copper and electrically conductive polymer.

22. The electrical connector assembly according to claim 21 wherein said electrically insulative material is selected from the group consisting essentially of polyimide, polytetrafluoroethylene and epoxy.

23. An information handling system comprising:
    an electrical connector assembly for electrically interconnecting first and second circuit members, said assembly including a housing adapted for being positioned substantially between said first and second circuit members, and a plurality of electrical contacts spacedly positioned within said housing, selected ones of said electrical contacts including a first, malleable conductive element comprised of metallic material and having a first modulus of elasticity and including first and second opposed contacting portions for engaging said first and second circuit members, respectively, and a second, spring element comprised of metallic material and joined to said first, conductive element in direct physical contact therewith and having a second modulus of elasticity greater than said first modulus of elasticity, said electrical contacts being of substantially C-shaped configuration.

* * * * *